(12) United States Patent
Lin et al.

(10) Patent No.: US 9,818,900 B2
(45) Date of Patent: Nov. 14, 2017

(54) HOT-CARRIER PHOTOELECTRIC CONVERSION DEVICE AND METHOD THEREOF

(71) Applicant: National Taiwan University, Taipei (TW)

(72) Inventors: Ching-Fuh Lin, Taipei (TW); Hsin-Yi Chen, Taipei (TW); Jiun-Jie Chao, Taipei (TW); Hong-Jhang Syu, Taipei (TW)

(73) Assignee: National Taiwan University, Taipei (TW)

( * ) Notice: Subject to any disclaimer, the term of this patent is extended or adjusted under 35 U.S.C. 154(b) by 0 days.

(21) Appl. No.: 14/183,927

(22) Filed: Feb. 19, 2014

(65) Prior Publication Data

US 2014/0361396 A1 Dec. 11, 2014

(30) Foreign Application Priority Data

Jun. 5, 2013 (TW) .............................. 102119892 A

(51) Int. Cl.
*H01L 31/06* (2012.01)
*H01L 51/42* (2006.01)
*H01L 51/00* (2006.01)

(52) U.S. Cl.
CPC .......... *H01L 31/06* (2013.01); *H01L 51/4213* (2013.01); *H01L 51/0039* (2013.01); *Y02E 10/549* (2013.01)

(58) Field of Classification Search
CPC ........ H01L 31/02; H01L 31/18; H01L 31/105
See application file for complete search history.

(56) References Cited

U.S. PATENT DOCUMENTS

| | | | | |
|---|---|---|---|---|
| 7,858,876 | B2* | 12/2010 | Lagally et al. | 136/255 |
| 2007/0099359 | A1* | 5/2007 | Klimov | H01L 31/0284 |
| | | | | 438/183 |
| 2008/0078444 | A1* | 4/2008 | Atanackovic | H01L 31/06 |
| | | | | 136/256 |

(Continued)

*Primary Examiner* — Fazli Erdem
(74) *Attorney, Agent, or Firm* — Mintz Levin Cohn Ferris Glovsky and Popeo, P.C.; Peter F. Corless; Steven M. Jensen

(57) ABSTRACT

The present invention provides a hot-carrier photoelectric conversion method. The method includes a hot-carrier photoelectric conversion device having a P-type semiconductor layer, an N-type semiconductor layer, and an inorganic conducting light-absorbing layer. The inorganic conducting light-absorbing layer is formed between the P-type semiconductor layer and the N-type semiconductor layer, and an electric field is formed between the P-type semiconductor layer and the N-type semiconductor layer. Moreover, photons are absorbed by the inorganic conducting light-absorbing layer to create electrons and holes. The electrons and holes are respectively shifted by the electric field or diffusion effect to the N-type semiconductor layer and the P-type semiconductor layer, so that the electrons and the holes are respectively conducted outside to create electric energy. Further, the present invention increases the quantity of photons absorbed, and makes electrons and holes be quickly conducted outside, thereby increasing photoelectric conversion efficiency, and creating electric energy with a high open-circuit voltage and a high current.

8 Claims, 8 Drawing Sheets

(56) References Cited

U.S. PATENT DOCUMENTS

| | | | |
|---|---|---|---|
| 2009/0178711 A1* | 7/2009 | Joo | H01L 21/02532 136/258 |
| 2009/0183774 A1* | 7/2009 | Atanackovic | H01L 31/02167 136/261 |
| 2010/0000598 A1* | 1/2010 | Lorenzetti | H01L 31/03529 136/255 |
| 2010/0078067 A1* | 4/2010 | Jia et al. | 136/256 |
| 2010/0132773 A1* | 6/2010 | Lagally et al. | 136/255 |
| 2010/0258164 A1* | 10/2010 | Takeda et al. | 136/252 |
| 2011/0042650 A1* | 2/2011 | Avouris et al. | 257/29 |
| 2011/0220191 A1* | 9/2011 | Flood | 136/255 |
| 2011/0221019 A1* | 9/2011 | Patel | H01L 31/101 257/432 |
| 2011/0315201 A1* | 12/2011 | Lin et al. | 136/255 |
| 2012/0031477 A1* | 2/2012 | Fogel et al. | 136/255 |
| 2012/0141799 A1* | 6/2012 | Kub | B82Y 30/00 428/408 |
| 2012/0205518 A1* | 8/2012 | Voutilainen et al. | 250/200 |
| 2012/0222737 A1* | 9/2012 | Conibeer et al. | 136/256 |
| 2012/0227787 A1* | 9/2012 | Drori et al. | 136/244 |
| 2012/0236385 A1* | 9/2012 | Yun | G02B 5/085 359/230 |
| 2012/0247545 A1* | 10/2012 | Aria et al. | 136/255 |
| 2012/0248413 A1* | 10/2012 | Dimmock et al. | 257/25 |
| 2012/0318337 A1* | 12/2012 | Watanabe et al. | 136/255 |
| 2012/0325318 A1* | 12/2012 | Meng | H01L 51/4213 136/263 |
| 2013/0000727 A1* | 1/2013 | Iwata et al. | 136/261 |
| 2013/0019924 A1* | 1/2013 | Naughton | H01L 31/03522 136/249 |
| 2013/0032782 A1* | 2/2013 | Gerasimos et al. | 257/21 |
| 2013/0082234 A1* | 4/2013 | Bao et al. | 257/9 |
| 2013/0082241 A1* | 4/2013 | Kub | H01L 27/148 257/9 |
| 2013/0162333 A1* | 6/2013 | Colli | H01L 31/02240 327/535 |
| 2013/0193404 A1* | 8/2013 | Koppens | H01L 31/02327 257/9 |
| 2014/0060643 A1* | 3/2014 | Martin et al. | 136/256 |
| 2014/0183441 A1* | 7/2014 | Park | H01L 31/085 257/9 |
| 2014/0209154 A1* | 7/2014 | Naughton | H01L 31/075 136/252 |
| 2014/0224305 A1* | 8/2014 | Nagashima | H01L 31/055 136/254 |
| 2014/0264275 A1* | 9/2014 | Zhong et al. | 257/21 |
| 2014/0318596 A1* | 10/2014 | Juluri et al. | 136/244 |
| 2015/0083206 A1* | 3/2015 | Novoselov | B82Y 30/00 136/256 |
| 2015/0311375 A1* | 10/2015 | Shen | H01L 31/1075 257/77 |

* cited by examiner

HOT-CARRIER PHOTOELECTRIC CONVERSION DEVICE AND METHOD THEREOF

CROSS-REFERENCES TO RELATED APPLICATIONS

This application claims under 35 U.S.C. §119(a) the benefit of Taiwanese Application No. 102119892, filed Jun. 5, 2013, the entire contents of which is incorporated herein by reference.

FIELD OF THE INVENTION

The present invention relates to a photoelectric conversion device and a method thereof, and more particularly, to a hot-carrier photoelectric conversion device and a method thereof.

BACKGROUND OF THE INVENTION

FIG. 1 shows a schematic diagram of a traditional photoelectric conversion device 1 and a photoelectric conversion method thereof. As shown in FIG. 1, the photoelectric conversion device 1 includes a P-type semiconductor layer 11 and an N-type semiconductor layer 12.

The P-type semiconductor layer 11 has a first valence band 111, a first conduction band 112, and a first bandgap 113. The N-type semiconductor layer 12 has a second valence band 121, a second conduction band 122, and a second bandgap 123. A depletion zone 13 is formed on the PN junction between the P-type semiconductor layer 11 and the N-type semiconductor layer 12. An internal electric field is created in the depletion zone 13.

A first potential slope 131 is formed between the first valence band 111 and the second valence band 121, and all three are below the Fermi level 133. A second potential slope 132 is formed between the first conduction band 112 and the second conduction band 122, and all three are above the Fermi level 133.

When the photoelectric conversion device 1 absorbs a plurality of photons 14 and produces electron-hole pairs such as a first electron 141a and a first hole 141b, and a second electron 142a and a second hole 142b, the first electron 141a may transition from the first valence band 111 to the first conduction band 112, and the second electron 142a may transition from the second valence band 121 to the second conduction band 122.

Then, owing to the diffusion effect, the first electron 141a and the second electron 142a may arrive on the second potential slope 132 of the depletion zone 13, and the first hole 141b and the second hole 142b may arrive below the first potential slope 131 of the depletion zone 13. Next, with the internal electric field in the depletion zone 13, the first electron 141a, the second electron 142a, the first hole 141b and the second hole 142b are separately transferred to an external circuit 15, thereby creating electrical energy.

One disadvantage of such conventional photoelectric conversion device is that both the P-type semiconductor layer and the N-type semiconductor layer have bandgaps. For example, the band gap of a P-type semiconductor layer or an N-type semiconductor layer made of silicon (Si) is about 1.1 eV (electron volts). As a result, the light absorption range of the photoelectric conversion device is restricted by the bandgaps, such that some photons cannot be absorbed by the photoelectric conversion device, resulting in a reduction in the number of photons being absorbed, and failure in producing a large amount of electrons and holes.

Furthermore, the electrons and holes are conducted externally at a lower rate with a lower capture, resulting in high energy loss, smaller voltage and current, and poorer photoelectric conversion efficiency. As a result, the photoelectric conversion device can only obtain a small number of low-energy electrons and holes (cold carrier), and produces electricity of a low voltage and a low current.

Therefore, there is a need to develop a photoelectric conversion device and a method thereof to overcome the above problems.

SUMMARY OF THE INVENTION

The present invention provides a hot-carrier photoelectric conversion device, which includes a P-type semiconductor layer; an N-type semiconductor layer; and an inorganic conducting light-absorbing layer formed between the P-type semiconductor layer and the N-type semiconductor layer.

The P-type semiconductor layer or the N-type semiconductor layer is a transparent or partially transparent semiconductor, so that photons pass through the transparent or partially transparent semiconductor layer to the inorganic conducting light-absorbing layer so as to create electrons and holes. Both the P-type semiconductor layer and the N-type semiconductor layer are inorganic semiconductor layers or organic semiconductor layer, or one is an inorganic semiconductor layer and the other one is an organic semiconductor layer.

The present invention further provides a hot-carrier photoelectric conversion method, which includes: providing a hot-carrier photoelectric conversion device including a P-type semiconductor layer, an N-type semiconductor layer, and an inorganic conducting light-absorbing layer, wherein the inorganic conducting light-absorbing layer is provided between the P-type semiconductor layer and the N-type semiconductor layer, and an electric field is formed between the P-type semiconductor layer and the N-type semiconductor layer.; absorbing photons with the inorganic conducting light-absorbing layer to create electrons and holes; and shifting the electrons and holes to the N-type semiconductor layer and the P-type semiconductor layer by an electric field or diffusion effect, respectively, so that the electrons and the holes are respectively conducted outside to create electric energy.

From the above, it can be understood that the hot-carrier photoelectric conversion device and the photoelectric conversion method of the present invention includes forming the inorganic conducting light-absorbing layer between the P-type semiconductor layer and the N-type semiconductor layer for absorbing photons, and the electrons and holes are respectively conducted outside to create electric energy. Therefore, the present invention may absorb photons of any wavelengths, increase the quantity of photons absorbed, and make large amounts of high-energy electrons and holes (hot carriers) be quickly conducted outside, thereby increasing the photoelectric conversion efficiency, and creating electric energy with a high open-circuit voltage and a high current.

BRIEF DESCRIPTION OF THE DRAWINGS

The present invention can be more fully understood by reading the following detailed description of the preferred embodiments, with reference made to the accompanying drawings, wherein.

DETAILED DESCRIPTION OF THE EMBODIMENTS

The present invention is described by the following specific embodiments. Those with ordinary skills in the arts can readily understand the other advantages and functions of the present invention after reading the disclosure of this specification.

It should be noted that the structures, proportions, sizes and the like shown in the attached drawings are to be considered only in conjunction with the contents of this specification to facilitate understanding and reading of those skilled in the art, and are not intended to limit the scope of present invention, thus they do not hold any real technically significance, and any changes or modifications in the structures, the proportions, the sizes and the like should fall within the scope of the technical contents disclosed in the present invention as long as they do not affect the effects and the objectives achieved by the present invention.

Meanwhile, terms such as "first", "second" and the like recited in this specification are for illustration purposes only, and are not intended to limit the scope of the present invention in any way, any changes or modifications of the relative relationships of elements are therefore to be construed as with the scope of the present invention as long as there is no substantial changes to the technical contents.

Figure 1:
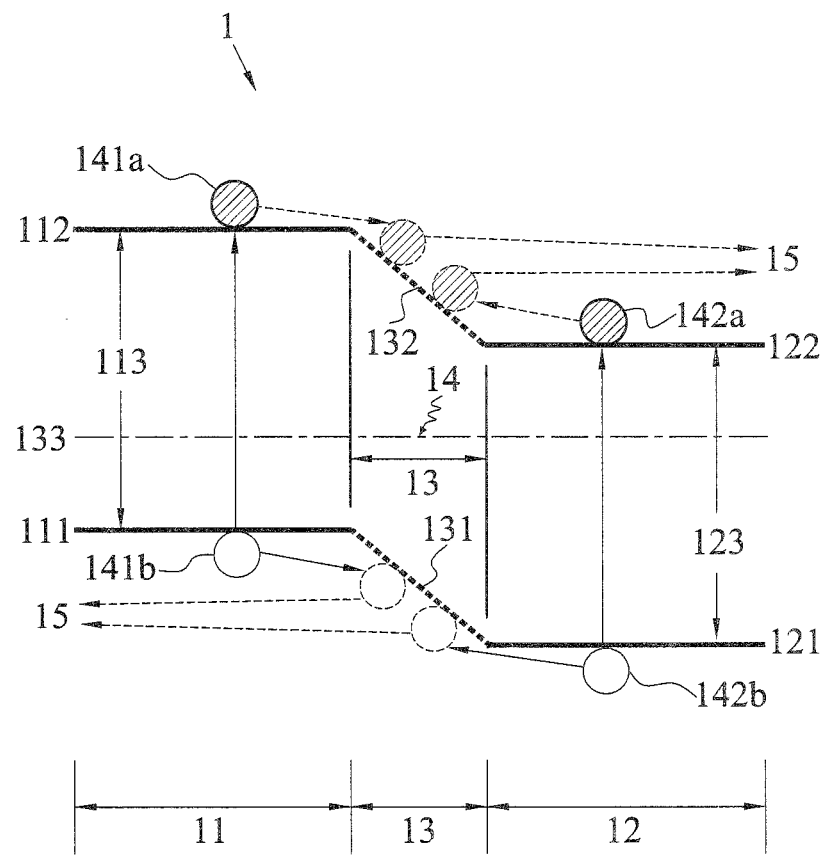
FIG. 1 is a schematic diagram illustrating the basic structure of a traditional photoelectric conversion device and photoelectric conversion method thereof.
Figure 2:
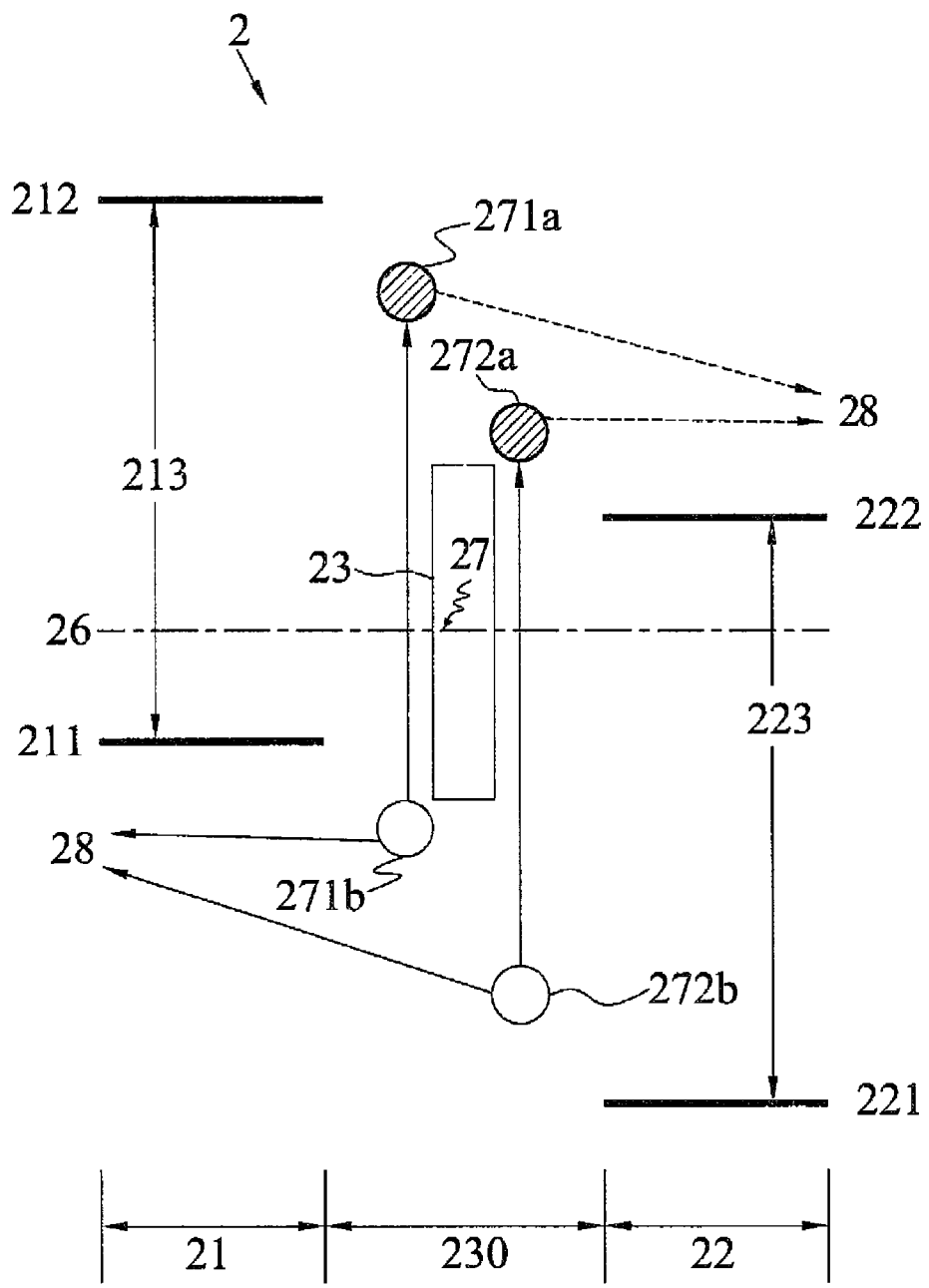
FIG. 2 is a schematic diagram illustrating the basic structure of a hot-carrier photoelectric conversion device and a photoelectric conversion method thereof according to a first embodiment of the present invention.

FIG. 2 illustrates the basic structure of a hot-carrier photoelectric conversion device 2 and a photoelectric conversion method thereof according to a first embodiment of the present invention. As shown in FIG. 2, the hot-carrier photoelectric conversion device 2 is a photoelectric conversion element and includes a P-type semiconductor layer 21, an N-type semiconductor layer 22 and an inorganic conducting light-absorbing layer 23. Both the P-type semiconductor layer 21 and the N-type semiconductor layer 22 can be inorganic semiconductor layers or organic semiconductor layers, or one is an inorganic semiconductor layer and the other is an organic semiconductor layer.

The P-type semiconductor layer 21 has a first valence band 211, a first conduction band 212, and a first bandgap 213 formed between the first valence band 211 and the first conduction band 212. The first valence band 211 and the first conduction band 212 are below and above the Fermi level 26, respectively. A P-type semiconductor layer with a higher-energy first conduction band 212 can be chosen to prevent recombination caused by electrons diffusing into the P-type semiconductor layer, which may reduce the carriers collected.

The N-type semiconductor layer 22 has a second valence band 221, a second conduction band 222, and a second band gap 223 formed between the second valence band 221 and the second conduction band 222. The second valence band 221 and the second conduction band 222 are below and above the Fermi level 26, respectively. An N-type semiconductor layer with a lower-energy second valence band 221 can be chosen to prevent recombination caused by holes diffusing into the N-type semiconductor layer, which may reduce the carriers collected.

The inorganic conducting light-absorbing layer 23 is provided between the P-type semiconductor layer 21 and the N-type semiconductor layer 22 for absorbing a plurality of photons in order to create electron-hole pairs such as a first electron 271a and a first hole 271b, and a second electron 272a and a second hole 272b. With an electric field or diffusing effect, the first electron 271a, the second electron 272a and the like move to be above the second conduction band 222 of the N-type semiconductor layer 22, while the first hole 271b, the second hole 272b, and the like move to be below the first valence band 211 of the P-type semiconductor layer 21. Thus, the first electron 271a and the second electron 272a, the first hole 271b and the second hole 272b, and the like are separately transferred to an external circuit 28, thereby obtaining a large amount of hot carriers with high energy such as the first electron 271a, the second electron 272a, the first hole 271b and the second hole 272b, and producing electrical energy having a high open-circuit voltage and a high current.

The inorganic conducting light-absorbing layer 23 can be made of a material such as a metal, graphite, graphene, and so on. Its thickness can be less than 50 nm (1 nm=$10^{-9}$ m), or less than or equal to a length five times the mean free path of the first electron 271a, first hole 271b or the like within the inorganic conducting light-absorbing layer 23. When the thickness of the inorganic conducting light-absorbing layer 23 is less than the mean free path, it means that the first electron 271a, the first hole 271b, and the like are conducted outside before collision with the atoms (before energy is dissipated), so that the first electron 271a, the first hole 271b, and the like conducted outside have high energy.

Moreover, if absorbing more photons 27 is desired, the P-type semiconductor layer 21 or the N-type semiconductor layer 22 can be made into a nanostructure, and the inorganic conducting light-absorbing layer 23 is formed on the surface of this nanostructure in such a way that it conforms with the nanostructure. This increases the equivalent light-absorbing thickness, and thus increases the light absorption of the hot-carrier photoelectric conversion device 2. Meanwhile, the inorganic conducting light-absorbing layer 23 is very closely located to the neighboring P-type semiconductor layer 21 or N-type semiconductor layer 22, so the traveling distance for the first hole 271b, the first electron 271a, or the like to the P-type semiconductor layer 21 or the N-type semiconductor layer 22 is less than or close to the mean free path.

As the thickness of the inorganic conducting light-absorbing layer 23 is close to the mean free path of the first electron 271a, the first hole 271b, and the like, when the first electron 271a and the first hole 271b are moved to the P-type semiconductor layer 21 and the N-type semiconductor layer 22, respectively, they do not go through several times of phonon scattering, and thus reserve higher energy, and the first electron 271a, the first hole 271b, and the like become the so-called hot carriers.

On the other hand, if the first electron 271a and the first hole 271b have lower energy, some of the energy can be transferred from higher-energy hot carriers to lower-energy hot carriers through carrier collisions. As a result, the inorganic conducting light-absorbing layer 23 may not necessarily have a bandgap, in other words, it can absorb the whole spectrum of the sunlight or various kinds of light.

Figure 3A:
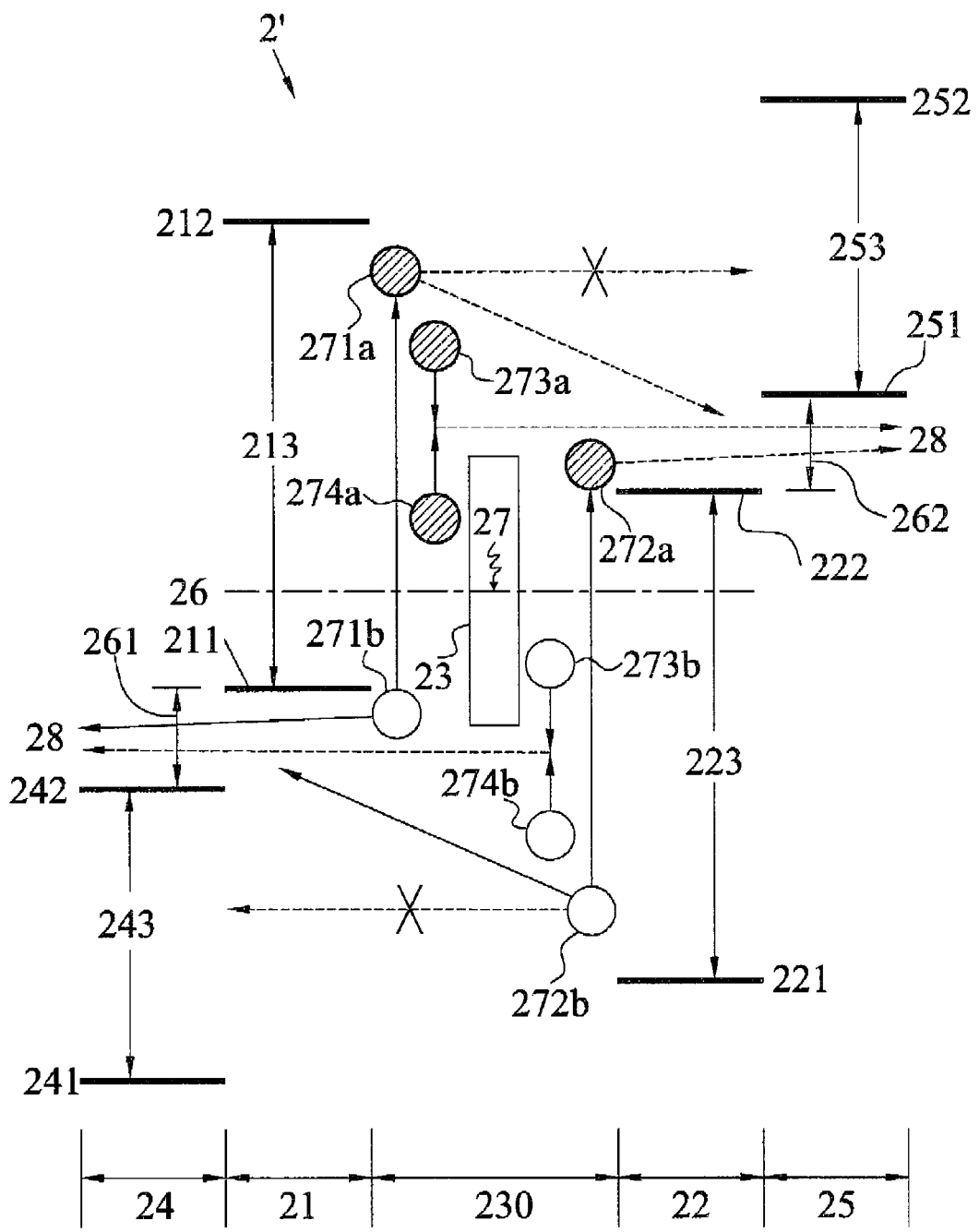
FIG. 3A is a schematic diagram illustrating the basic structure of a hot-carrier photoelectric conversion device and a photoelectric conversion method thereof according to a second embodiment of the present invention.

FIG. 3A is a schematic diagram illustrating the basic structure of a hot-carrier photoelectric conversion device 2' and the photoelectric conversion method thereof according to a second embodiment of the present invention. The hot-carrier photoelectric conversion device 2' and the photoelectric conversion method are similar to the hot-carrier photoelectric conversion device 2 and photoelectric conversion method, as described in FIG. 2, and the major differences between them are as follows.

As shown in FIG. 3A, the hot-carrier photoelectric conversion device 2' further includes a first semiconductor layer 24 and a second semiconductor layer 25 made of N-type or P-type semiconductor.

The first semiconductor layer 24 is formed on the P-type semiconductor layer 21, and includes a third valence band 241, a third conduction band 242, and a third bandgap 243 formed between the third valence band 241 and the third conduction band 242. The energy level of the third conduction band 242 of the first semiconductor layer 24 is lower than the first valence band 211 of the P-type semiconductor layer 21, such that a first energy-level channel 261 is formed between the third conduction band 242 and the first valence band 211. The first hole 271b to a fourth hole 274b and the like may be conducted to the external circuit 28 through the first energy-level channel 261, thereby obtaining a large amount of high-energy hot carriers (the first hole 271b to the fourth hole 274b and the like). A P-type semiconductor layer with a higher-energy first conduction band 212 can be chosen to prevent electrons from diffusing into the P-type semiconductor layer, which may reduce the carriers collected.

Moreover, when the energy of the fourth hole 274b is greater than the energy level of the first energy-level channel 261, the fourth hole 274b cannot pass through the first semiconductor layer 24 or the third band gap 243. In this case, the energy can be redistributed between a lower-energy third hole 273b and the higher-energy fourth hole 274b, so that the fourth hole 274b may be conducted to the external circuit 28 through the first energy-level channel 261. As such, the number of holes that are conducted to the external circuit 28 can be increased.

Similarly, when the energy of the second hole 272b is greater than the energy level of the first energy-level channel 261, the second hole 272b cannot pass through the first semiconductor layer 24 or the third bandgap 243. In this case, the energy can be redistributed between a lower-energy hole and the higher-energy second hole 272b, so that the second hole 272b may be conducted to the external circuit 28 through the first energy-level channel 261, thereby increasing the number of holes that can be conducted to the external circuit 28.

Furthermore, the second semiconductor layer 25 is formed on the N-type semiconductor layer 22, and includes a fourth valence band 251, a fourth conduction band 252, and a fourth bandgap 253 formed between the fourth valence band 251 and the fourth conduction band 252. The energy level of the fourth valence band 251 of the second semiconductor layer 25 is higher than the second conduction band 222 of the N-type semiconductor layer 22, such that a second energy-level channel 262 is formed between the fourth valence band 251 and the second conduction band 222. The first electron 271a to a fourth electron 274a and the like may be conducted to the external circuit 28 through the second energy-level channel 262, thereby obtaining a large amount of high-energy hot carriers (the first electron 271a to the fourth electron 274a and the like). An N-type semiconductor layer with a lower-energy second valence band 221 can be chosen to prevent holes from diffusing into the N-type semiconductor layer, which may reduce the carriers collected. Moreover, when the energy of a third electron 273a is greater than the energy level of the second energy-level channel 262, the third electron 273a cannot pass through the second semiconductor layer 25 or the fourth band gap 253. In this case, the energy can be redistributed between the lower-energy fourth electron 274a and the higher-energy third electron 273a, so that the third electron 273a may be conducted to the external circuit 28 through the second energy-level channel 262, thereby increasing the number of electrons that can be conducted to the external circuit 28.

Similarly, when the energy of the first electron 271a is greater than the energy level of the second energy-level channel 262, the first electron 271a cannot pass through the second semiconductor layer 25 or the fourth band gap 253. In this case, the energy can be redistributed between a lower-energy electron and the higher-energy first electron 271a, so that the first electron 271 a may be conducted to the external circuit 28 through the second energy-level channel 262, thereby increasing the number of electrons that can be conducted to the external circuit 28.

In the second embodiment, the redistribution of energy can be applied to both the electrons and the holes at the same time, or to just the electrons or the holes. As electrons are generally spread across a wider energy range, energy redistribution is usually applied to electrons in actual practice, thus allowing the hot-carrier photoelectric conversion device 2' to create more hot carriers (electrons).

Figure 3B:
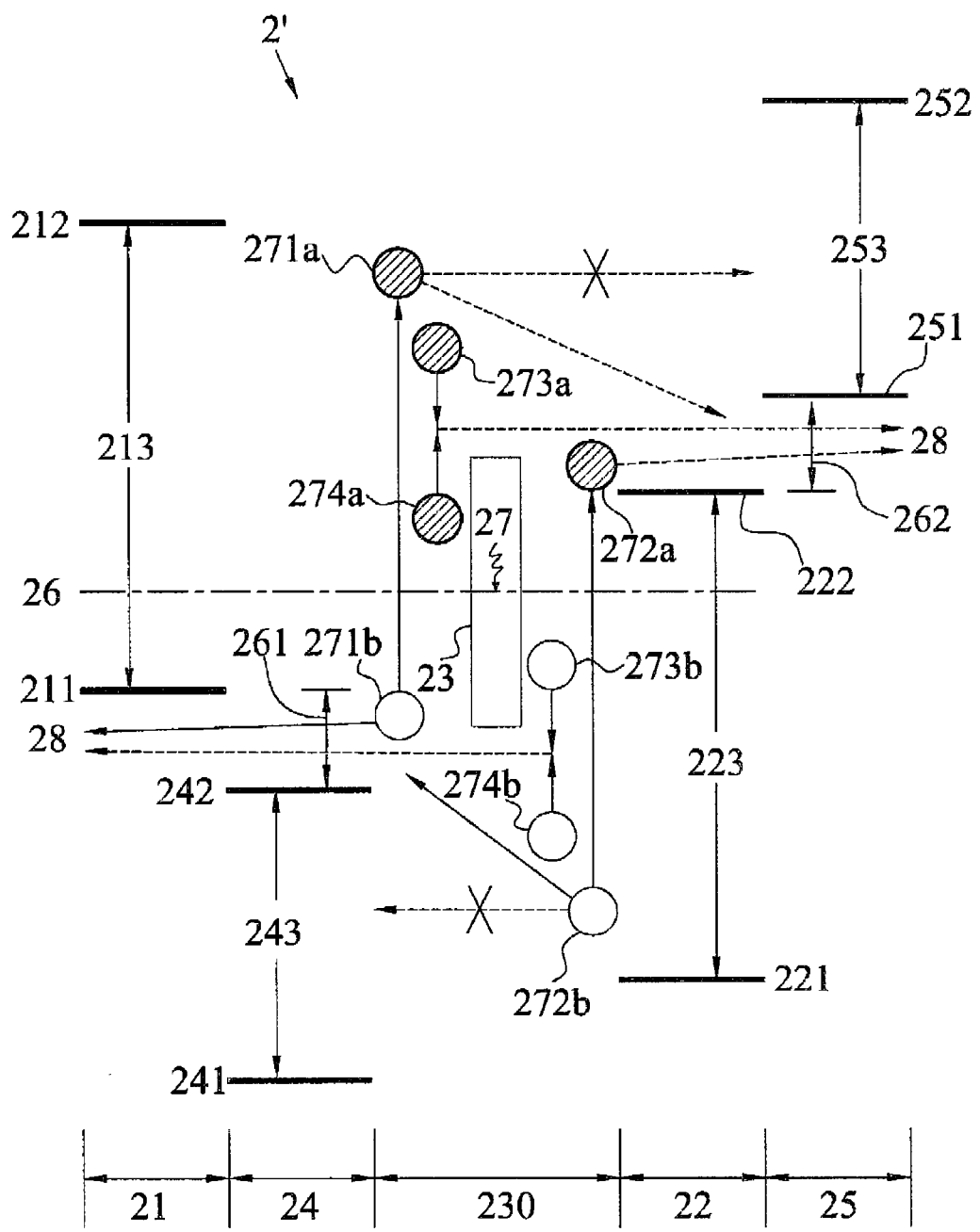
FIGS. 3B to 3C are schematic diagrams illustrating alternatives of the basic structure of a hot-carrier photoelectric conversion device and a photoelectric conversion method thereof according to the second embodiment of the present invention.
Figure 3C:
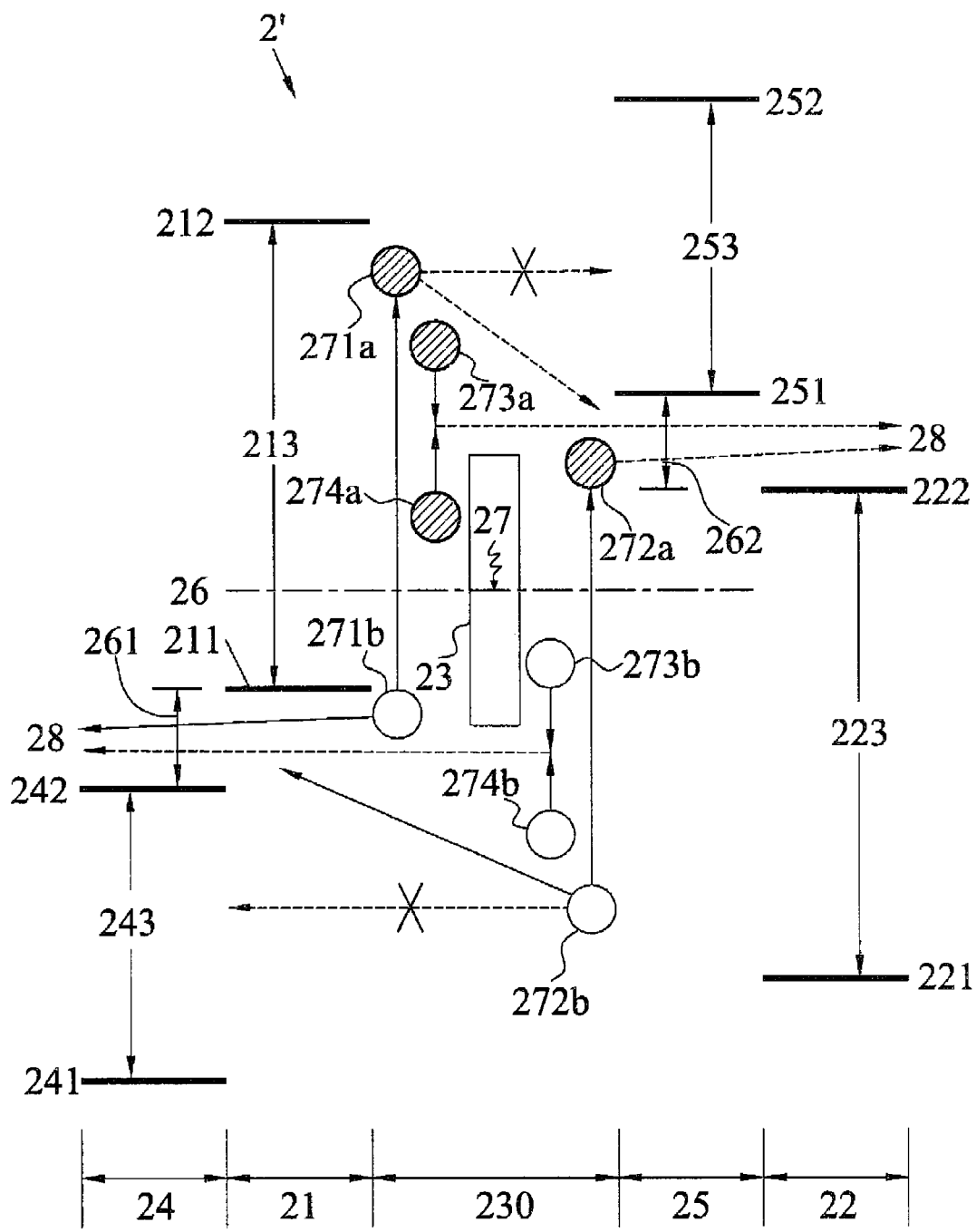

FIGS. 3B to 3C are schematic diagrams illustrating alternatives of the basic structure of a hot-carrier photoelectric conversion device 2' and the photoelectric conversion method thereof according to the second embodiment of the present invention. The hot-carrier photoelectric conversion devices 2' of FIGS. 3B and 3C are similar to that described in FIG. 3A with some differences as follows.

As shown in FIG. 3A, the first semiconductor layer 24 is formed on the P-type semiconductor layer 21, whereas as shown in FIG. 3B, the first semiconductor layer 24 is formed between the P-type semiconductor layer 21 and the inorganic conducting light-absorbing layer 23.

Similarly, as shown in FIG. 3A, the second semiconductor layer 25 is formed on the N-type semiconductor layer 22, whereas as illustrated in FIG. 3C, the second semiconductor layer 25 is formed between the N-type semiconductor layer 22 and the inorganic conducting light-absorbing layer 23.

That is, the order of the first semiconductor layer 24 and the P-type semiconductor layer 21 may be reversed. Also, the order of the second semiconductor layer 25 and the N-type semiconductor layer 22 may be reversed. Three embodiments with respect to the above orders are illustrated in FIGS. 3A, 3B, and 3C. According to the present invention, more than 3 combinations can be derived from the above disclosures.

Figure 4A:
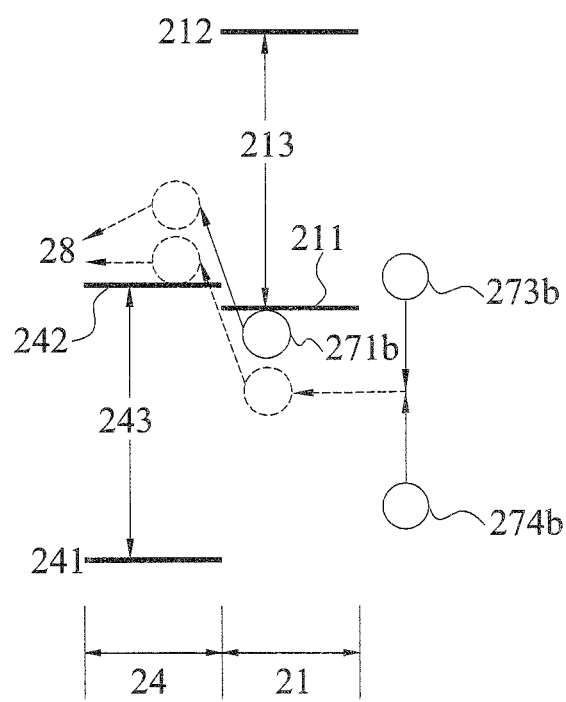
FIG. 4A is a schematic diagram illustrating the P-type semiconductor layer and the first semiconductor layer according to the present invention.

FIG. 4A illustrates an alternative of the P-type semiconductor layer 21 and the first semiconductor layer 24 of the present invention, which may be used instead of the P-type semiconductor layer 21 and the first semiconductor layer 24, as shown in FIG. 3. The P-type semiconductor layers 21 and first semiconductor layers 24, as shown in FIG. 4A and FIG. 3, are similar but have some differences as follows.

As shown in FIG. 4A, for the P-type semiconductor layer 21 and the first semiconductor layer 24, when the third conduction band 242 of the first semiconductor layer 24 is higher than the first valence band 211 of the P-type semiconductor layer 21, the first hole 271b on the first valence band 211 of the P-type semiconductor layer 21 theoretically cannot directly pass through the first semiconductor layer 24. However, when the difference in energy between the third conduction band 242 of the first semiconductor layer 24 and the first valence band 211 of the P-type semiconductor layer 21 is less than 0.1~0.2 eV, the first hole 271b may jump onto the third conduction band 242 of the first semiconductor layer 24 by phonon collision, where it is conducted to the external circuit 28 through the third conduction band 242 or an energy-level channel.

In addition, as for the lower-energy third hole 273b and the higher-energy fourth hole 274b that are not on the first valence band 211 of the P-type semiconductor layer 21, they can also be moved onto the first valence band 211 of the P-type semiconductor layer 21 by energy redistribution, and jump onto the third conduction band 242 of the first semiconductor layer 24 through phonon collision, thereby allowing both the third hole 273b and the fourth hole 274b to be conducted to the external circuit 28 via the third conduction band 242 or the first energy-level channel 261.

From FIGS. 3A and 4A, it can be seen that the hot-carrier photoelectric conversion device 2' of the present invention may choose the appropriate P-type semiconductor layer 21 and the first semiconductor layer 24 for collecting holes (hot carriers).

Figure 4B:
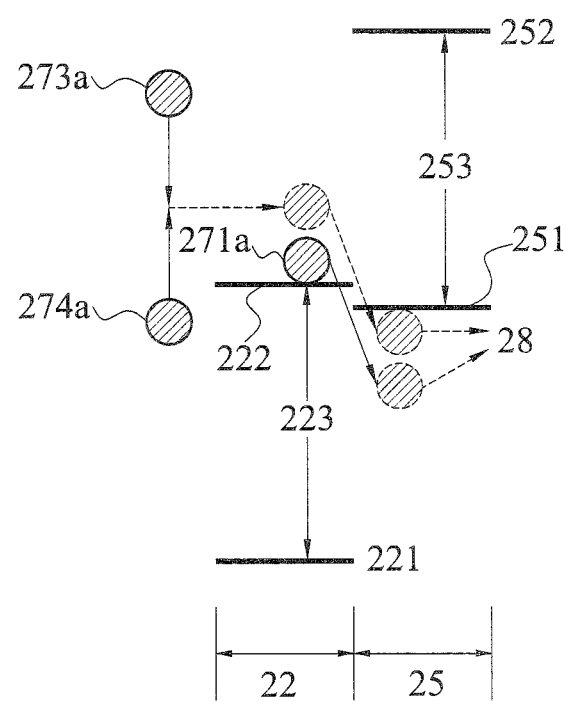
FIG. 4B is a schematic diagram illustrating the N-type semiconductor layer and the second semiconductor layer according to the present invention.

FIG. 4B is a schematic diagram illustrating an alternative of the N-type semiconductor layer 22 and second semiconductor layer 25 of the present invention, which can be used to replace the N-type semiconductor layer 22 and the second semiconductor layer 25, as shown in FIG. 3. The N-type semiconductor layer 22 and second semiconductor layer 25, as shown in FIGS. 4B and FIG. 3, are similar but have some differences as follows.

As shown in FIG. 4B, for the N-type semiconductor layer 22 and second semiconductor layer 25, when the fourth valence band 251 of the second semiconductor layer 25 is lower than the second conduction band 222 of the N-type semiconductor layer 22, the first electron 271a on the second conduction band 222 of the N-type semiconductor layer 22 theoretically cannot directly pass through the second semiconductor layer 25. However, when the difference in energy between the fourth valence band 251 of the second semiconductor layer 25 and the second conduction band 222 of the N-type semiconductor layer 22 is less than 0.1~0.2 eV, the first electron 271a may jump onto the fourth valence band 251 of the second semiconductor layer 25 by phonon collision, where it is conducted to the external circuit 28 through the fourth valence band 251 or an energy-level channel.

In addition, as for the higher-energy third electron 273a and the lower-energy fourth electron 274a that are not on the second conduction band 222 of the N-type semiconductor layer 22, they can also be moved onto the fourth valence band 251 of the N-type semiconductor layer 22 by energy redistribution, and jump onto the fourth valence band 251 of the second semiconductor layer 25 through phonon collision, thereby allowing both the third electron 273a and the fourth electron 274a to be conducted to the external circuit 28 via the fourth valence band 251 or an energy-level channel.

From FIGS. 3A and 4B above, it can be seen that the hot-carrier photoelectric conversion device 2' of the present invention may choose the appropriate N-type semiconductor layer 22 and second semiconductor layer 25 for collecting electrons (hot carriers).

In FIGS. 4A and 4B, the redistribution of energy can be applied to both the electrons and the holes at the same time, or to just the electrons or the holes. As electrons are generally spread across a wider energy range, energy redistribution is usually applied to electrons in actual practice, thus allowing the hot-carrier photoelectric conversion device 2' to create more hot carriers (electrons).

Figure 5:
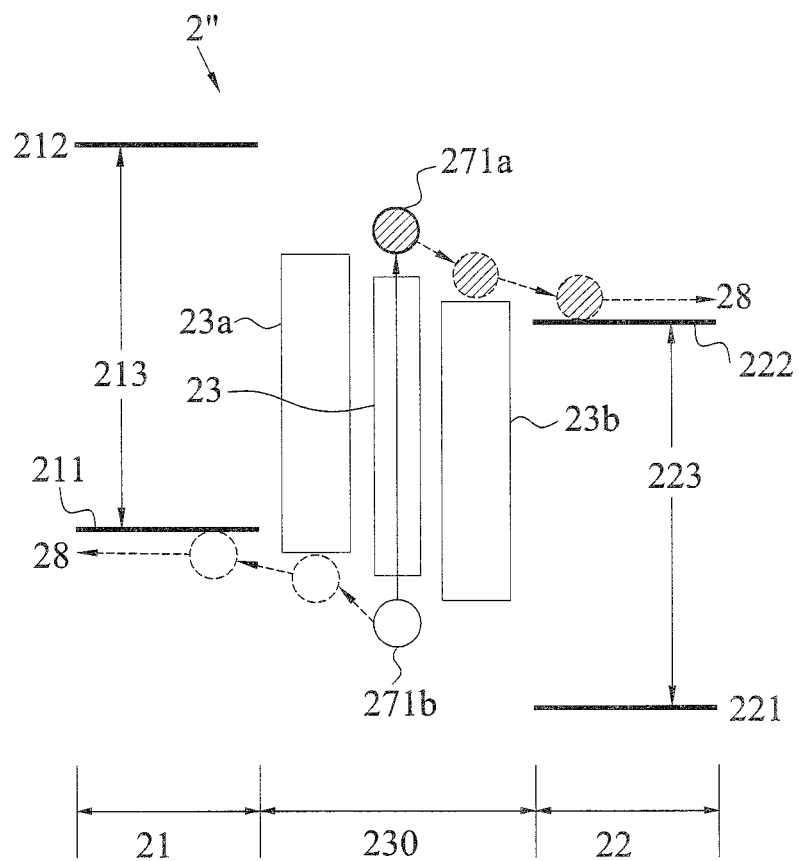
FIG. 5 is a schematic diagram illustrating the basic structure of a hot-carrier photoelectric conversion device and a photoelectric conversion method thereof according to a third embodiment of the present invention.

FIG. 5 shows a schematic diagram of a hot-carrier photoelectric conversion device 2" and the photoelectric conversion method thereof according to a third embodiment of the present invention. As shown in FIG. 5, the hot-carrier photoelectric conversion device 2" may include a P-type electric field enhancing level 23a and an N-type electric field enhancing level 23b.

The material of the P-type electric field enhancing level 23a can be $MoO_3$ or $MoO_x$. It can be formed between the P-type semiconductor layer 21 and the inorganic conducting light-absorbing layer 23 for enhancing the intensity of the internal electric field between the P-type semiconductor layer 21 and the inorganic conducting light-absorbing layer 23, allowing hot carriers such as the first hole 271b and the like to be quickly separated to the P-type semiconductor layer 21.

The material of the N-type electric field enhancing level 23b can be PFN ((poly[(9,9-bis(3'-(N,N-dimethylamino)propyl)-2,7-fluorene)-alt-2,7-(9,9-dioctylfluorene)]. It can be formed between the N-type semiconductor layer 22 and the inorganic conducting light-absorbing layer 23 for enhancing the intensity of the internal electric field between the N-type semiconductor layer 22 and the inorganic conducting light-absorbing layer 23, allowing hot carriers such as the first electron 271a and the like to be quickly separated to the N-type semiconductor layer 22.

As a result, the hot-carrier photoelectric conversion device 2" of the present invention is able to create a large amount of hot carriers with a high open-circuit voltage and a high current such as the first electron 271a and the first hole 271b. These hot carriers such as the first electron 271a and the first hole 271b are further conducted to the external circuit 28 through the internal electric field, energy-level channels, phonon collision and/or energy redistribution described in FIGS. 2 to 4B above.

According to the descriptive example of the present invention, the materials for electric field enhancing discussed above may not be $MoO_x$ or PFN. The present invention is not limited to $MoO_x$ or PFN, but can be other materials.

From the above, it can be understood that the hot-carrier photoelectric conversion device and the photoelectric conversion method of the present invention have at least the following advantages.

(1) Since the inorganic conducting light-absorbing layer does not have a bandgap of a P-type or N-type semiconductor layer as that in the prior art, the inorganic conducting light-absorbing layer of the present invention formed between the P-type semiconductor layer and the N-type semiconductor layer may absorb photons of any wavelengths, thereby increasing the quantity of photons absorbed, so as to create large amounts of electrons and holes.

(2) The thickness of the inorganic conducting light-absorbing layer is very thin—50 nm or less, or smaller than or equal to five times the mean free path of the electrons or holes within the inorganic conducting light-absorbing layer, so that the electrons and holes can be quickly conducted to the external circuit by the electric field or the diffusion effect regardless of their energy. As such, the electrons and the holes can be conducted at a high speed with a large capture and low energy loss, thereby obtaining a large amount of high-energy electrons and holes (hot carriers), and creating electric energy with a high open-circuit voltage and a high current.

(3) A first energy-level channel is formed between the P-type semiconductor layer and the first semiconductor layer, and a second energy-level channel is formed between the N-type semiconductor layer and the second semiconductor layer, so that the electrons and the holes are conducted to the external circuit via the first and the second energy-level channels, respectively. As a result, large amounts of high-energy electrons and holes can be quickly captured, so as to increase photoelectric conversion efficiency and create electric energy with a high open-circuit voltage and a high current.

(4) A P-type electric field enhancing layer and/or an N-type electric field enhancing layer are/is formed on one or both sides of the inorganic conducting light-absorbing layer to enhance the intensity of the internal electric field, so that the hot carriers (holes and electrons) can be quickly separated to the P-type semiconductor layer and the N-type semiconductor layer, respectively.

The above embodiments are only used to illustrate the principles of the present invention, and should not be construed as to limit the present invention in any way. The above embodiments can be modified by those with ordinary skill in the art without departing from the scope of the present invention as defined in the following appended claims.

What is claimed is:

1. A hot-carrier photoelectric conversion device, comprising:
    a P-type semiconductor layer;
    an N-type semiconductor layer;
    an inorganic conducting light-absorbing layer formed between the P-type semiconductor layer and the N-type semiconductor layer, wherein the inorganic conducting light-absorbing layer has a thickness of no more than five times a mean free path of electrons or holes within the inorganic conducting light-absorbing layer, and the inorganic conducting light-absorbing layer produces hot carriers, and wherein at least one of the P-type semiconductor layer and the N-type semiconductor layer is a transparent or partially transparent semiconductor layer, and the inorganic conducting light-absorbing layer absorbs photons passing through the transparent or partially transparent semiconductor layer to create the electrons and holes; and
    a second semiconductor layer formed on the N-type semiconductor layer, or formed between the N-type semiconductor layer and the inorganic conducting light-absorbing layer, wherein a valence band of the second semiconductor layer has an energy level higher than an energy level of a conduction band of the N-type semiconductor layer, or wherein the valence band of the second semiconductor layer has the energy level lower than the energy level of the conduction band of the N-type semiconductor layer, and an energy difference between the valence band of the second semiconductor layer and the conduction band of the N-type semiconductor layer is less than 0.2 eV.

2. The hot-carrier photoelectric conversion device of claim 1, wherein both the P-type semiconductor layer and the N-type semiconductor layer are inorganic semiconductor layers or organic semiconductor layers, or one of the P-type semiconductor layer and the N-type semiconductor layer is an inorganic semiconductor layer and the other one is an organic semiconductor layer.

3. The hot-carrier photoelectric conversion device of claim 1, wherein the inorganic conducting light-absorbing layer has a thickness of less than 50 nm.

4. The hot-carrier photoelectric conversion device of claim 1, further comprising a first semiconductor layer formed on the P-type semiconductor layer, or formed between the P-type semiconductor layer and the inorganic conducting light-absorbing layer, wherein a conduction band of the first semiconductor layer has an energy level lower than an energy level of a valence band of the P-type semiconductor layer.

5. The hot-carrier photoelectric conversion device of claim 1, further comprising a first semiconductor layer formed on the P-type semiconductor layer, or formed between the P-type semiconductor layer and the inorganic conducting light-absorbing layer, wherein a conduction band of the first semiconductor layer has an energy level higher than an energy level of a valence band of the P-type semiconductor layer, and an energy difference between the conduction band of the first semiconductor layer and the valence band of the P-type semiconductor layer is less than 0.2 eV.

6. The hot-carrier photoelectric conversion device of claim 1, further comprising a P-type electric field enhancing layer formed between the P-type semiconductor layer and the inorganic conducting light-absorbing layer.

7. The hot-carrier photoelectric conversion device of claim 1, further comprising an N-type electric field enhancing layer formed between the N-type semiconductor layer and the inorganic conducting light-absorbing layer.

8. A hot-carrier photoelectric conversion device, comprising:
    a P-type semiconductor layer;
    an N-type semiconductor layer;
    an inorganic conducting light-absorbing layer formed between the P-type semiconductor layer and the N-type semiconductor layer, wherein the inorganic conducting light-absorbing layer has a thickness of no more than five times a mean free path of electrons or holes within the inorganic conducting light-absorbing layer, and the inorganic conducting light-absorbing layer produces hot carriers, and wherein at least one of the P-type semiconductor layer and the N-type semiconductor layer is a transparent or partially transparent semiconductor layer, and the inorganic conducting light-absorbing layer absorbs photons passing through the transparent or partially transparent semiconductor layer to create the electrons and holes; and
    a first semiconductor layer formed on the P-type semiconductor layer, or formed between the P-type semiconductor layer and the inorganic conducting light-absorbing layer, wherein a conduction band of the first semiconductor layer has an energy level lower than an energy level of a valence band of the P-type semiconductor layer, or wherein the conduction band of the first semiconductor layer has the energy level higher than the energy level of the valence band of the P-type semiconductor layer, and an energy difference between the conduction band of the first semiconductor layer and the valence band of the P-type semiconductor layer is less than 0.2 eV.

* * * * *